United States Patent [19]

Tanimoto et al.

[11] Patent Number: 4,800,339

[45] Date of Patent: Jan. 24, 1989

[54] AMPLIFIER CIRCUIT

[75] Inventors: Hiroshi Tanimoto, Kawasaki; Hisashi Yamada, Yokohama, both of Japan

[73] Assignee: Kabushiki Kaisha Toshiba, Kawasaki, Japan

[21] Appl. No.: 79,141

[22] Filed: Jul. 29, 1987

[30] Foreign Application Priority Data

Aug. 13, 1986 [JP] Japan ................................ 61-190104

[51] Int. Cl.⁴ ........................... H03F 3/45; H03F 3/26
[52] U.S. Cl. .................................... 330/253; 330/255; 330/266
[58] Field of Search ............... 330/253, 255, 261, 252, 330/266

[56] References Cited

U.S. PATENT DOCUMENTS 4,480,230 10/1964 Brehmer et al. ..................... 330/253
4,529,948 7/1965 Bingham ............................. 330/264

Primary Examiner—Gene Wan
Attorney, Agent, or Firm—Oblon, Fisher, Spivak, McClelland & Maier

[57] ABSTRACT

An amplifier circuit has a voltage-amplifying stage, an output stage including a push-pull circuit comprising at least one complementary pair of output transistors, and a drive stage for driving the output transistors of the output stage in response to the output of the voltage-amplifying stage. The drive stage includes a subtraction unit and a signal-converting unit. The subtraction unit subtracts the output voltage of the voltage-amplifying stage, which is based on the first pole-potential of a power supply, from the reference voltage output by a reference voltage-generating unit also included in the drive stage. The subtraction unit outputs a voltage corresponding to the difference between the reference voltage and the output voltage of the voltage-amplifying stage, and supplies this voltage to the signal-converting unit. The signal-converting unit shifts the level of the input voltage, thereby producing a voltage signal based on the second pole-potential of the power supply. One of the output transistors is driven by the voltage signal, whereas the other output transistor is driven by the output voltage of the voltage-amplifying stage.

13 Claims, 6 Drawing Sheets

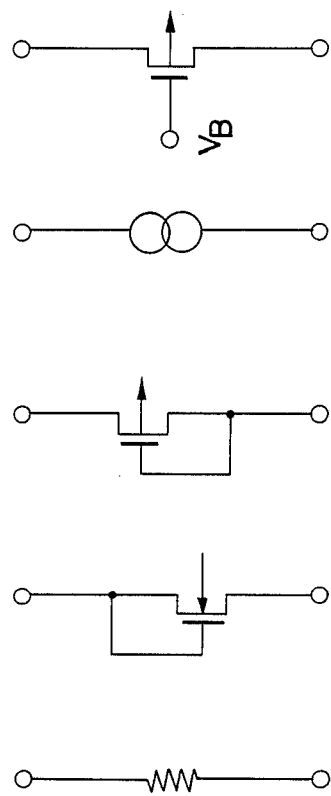

AMPLIFIER CIRCUIT

BACKGROUND OF THE INVENTION

The present invention relates to an amplifier circuit, and more particularly, to an amplifier circuit the output stage of which is comprised of a complementary push-pull circuit and which can be suitably used as an operational amplifier.

In a circuit including an operational amplifier, for example, an integrated circuit for processing analog signals, it is necessary that the operational amplifier should provide an output having as great a voltage amplitude as possible, in order to process the signals with a high S/N ratio. Most preferably, the maximum output voltage of the operational amplifier should reach the power supply voltage. It is necessary for the amplifier to produce an output of a great voltage amplitude, particularly when the power supply for the amplifier is a small-power, low-voltage battery. Further, when it is required that the operational amplifier consume as little power as possible, the output-stage transistor of the amplifier, whose bias current is large, must assume an operation similar to a so-called "class B operation", so that the amplifier consumes a minimal amount of power during a non-input period. This is one of the design requirements when the power available to the amplifier is limited.

In order to satisfy these requirements, the output stage of the operational amplifier must be:

(1) a common-source circuit of a voltage-gain type whose output is taken from the drain of an output FET; or (2) a common-emitter circuit of a voltage-gain type whose output is taken from the collector of a bipolar transistor.

Let us use, herein, the word "transistor" in its broadest sense, encompassing both an FET and a bipolar transistor. Also, let us use the word "first electrode" to mean the source of an FET and also the emitter of a bipolar transistor, which receive carriers; the word "second electrode" will mean the drain of the FET and the collector of the bipolar transistor, which supply the carriers, and the word "third electrode" will mean the gate of the FET and also the base of the bipolar transistor, which controls the flow of the carrier. Then, it can be said that the output-stage circuit of the operational amplifier must have its first electrode connected to the ground, in order to fulfill the requirements described above. This is because, since the potential of the third electrode of the transistor cannot become higher than the power supply voltage, the maximum output voltage would be lower than the voltage of the third electrode by the threshold voltage of the transistor if the output is taken from the first electrode of the transistor, whereby the maximum output-voltage amplitude will substantially decrease. When the transistor is a silicon semiconductor element, its threshold voltage is about 1 V for an FET, and about 0.6 V for a bipolar transistor. The loss of the output-voltage amplitude, which results from the threshold voltage of the transistor, cannot be negligibly small when the power supply voltage is, for example, 3 V (two 1.5 V dry cells).

An amplifier circuit whose output stage is a common-source, complementary push-pull circuit using FETs is disclosed in R. Gregorian et al. IEEE JSSC., *SC*-14, 6, pp. 970–980, December 1979. More precisely, this circuit is a CMOS operational amplifier. The main components of this CMOS operational amplifier are shown in FIG. 1. As is shown in this figure, a differential pair of NMOS (N-channel MOS) FETs Q1 and Q2 is provided. A current mirror circuit comprised of a pair of PMOS (P-channel MOS) FETs Q3 and Q4 is coupled to the loads of NMOSFETs Q1 and Q2. The differential pair of NMOSFETs Q1 and Q2 and the current mirror circuit constitute a differential amplifier, or voltage-amplifying stage VA which receives an input signal. The output signal of voltage-amplifying stage VA is level-shifted by source-follower stage SF formed of NMOS-FETs Q5 and Q7. Voltage-amplifying stage VA further comprises NMOSFET Q6. This NMOSFET Q6 functions as a constant-current source. Similarly, NMOSFET Q7 of source follower stage SF functions as a constant-current source. The signal, which has been level-shifted by source follower circuit SF, is supplied to the gate of NMOSFET Q8. The output voltage of voltage-amplifying stage VA is applied to the gate of PMOSFET Q9. NMOSFET Q8 and PMOSFET Q9 constitute output stage OS which is a common-source, complementary push-pull circuit.

Since output stage OS of the amplifier circuit is a common-source, complementary push-pull circuit, the maximum positive and negative output voltages can be equal to the positive and negative power supply voltages +E and −E, respectively. In other words, the amplifier can provide a great output amplitude. Further, the two FETs forming output stage OS, which performs a push-pull operation, can operate in the class AB mode, provided that source-follower stage SF achieves an appropriate levelshifting of the output signal of voltage-amplifying stage VA. Hence, the amplifier circuit of FIG. 1 can satisfy the requirements described above.

The power-supply voltage applied to the operational amplifier shown in FIG. 1 is not always constant. Therefore, it is required that the amplifier should function correctly even if the power-supply voltage varies within a certain range. In particular, when the operational amplifier is made in the form of an integrated circuit, the elements forming the amplifier are inevitably somewhat different in their characteristics, due to minor variations resulting during the manufacturing process. It is necessary for the amplifier to function correctly in spite of this characteristic difference among its elements.

In the amplifier circuit of FIG. 1, both voltage-amplifying stage VA and source-follower stage SF are driven by a constant current. Hence, the bias current does not vary when the power-supply voltage changes. However, the output voltages of stages VA and SF vary when the power-supply voltage changes. Consequently, the bias current of output stage OS changes in response to the changes of the power-supply voltage. To make matters worse, the bias current of output stage OS varies even if the characteristics of the elements, for example, the threshold voltages of FETs Q8 and Q9, fluctuate. In the worst case, both FETs constituting output stage OS are cut off due to an undesirable combination of a power-supply voltage and a threshold voltage of either FET. When both FETs of stage OS are cut off, the amplifier circuit will inevitably have a dead-band. Or, due to such an undesirable combination, an excessive bias current will flow through output stage OS, in some cases.

The conventional amplifier circuit, whose output stage is a complementary push-pull circuit comprising an NMOSFET and a PMOSFET and which supplies an output from the node of the second electrodes of these MOSFETs, can indeed provide a great output amplitude from a limited power-supply voltage and can reduce power consumption. Nonetheless, it has the inherent drawback that the bias current of the output stage varies when the power-supply voltage fluctuates or when the MOSFETs have different characteristics.

Therefore, to use this amplifier circuit practically, it is necessary to restrict fluctuations in the power-supply voltage to a narrow range. In addition, to manufacture this amplifier circuit, it is necessary to use elements which differ as little as possible in their characteristics. As a result, it is difficult to manufacture the amplifier circuit with a good yield, and the cost will be unavoidably high. cl SUMMARY OF THE INVENTION It is accordingly the object of the present invention to provide an amplifier circuit which can provide a great output amplitude from a relatively low powersupply voltage, and can operate stably, without being adversely influenced by the fluctuation of the powersupply voltage or by the difference in characteristic among the elements forming the circuit and/or by the fluctuation of the characteristic of each element.

An amplifier circuit according to the invention comprises a voltage-amplifying stage, an output stage including a push-pull circuit comprised of at least one complementary pair of output transistors, and a drive stage for driving the output transistors in accordance with the output of the voltage-amplifying stage. The drive stage includes a subtraction unit and a reference voltage-generating unit. The reference voltage-generating unit generates a reference voltage. The subtraction unit subtracts the output voltage of the voltage-amplifying stage, which is based on a first potential of a power supply, from the reference voltage, thereby outputting a difference between the reference voltage and the output voltage of the voltage-amplifying stage. The output voltage of the subtraction unit is converted to a voltage signal based on the second potential of the power supply. This signal drives one of the output transistors of the push-pull circuit, whereas the output voltage of the voltage-amplifying stage drives the other output transistor.

The bias current of the output transistor driven by the output voltage of the voltage-amplifying stage is determined by the constant-current source for the differential amplifier constituting the voltage-amplifying stage. This bias current is maintained even if the power-supply voltage changes. The voltage signal, which is supplied to the control electrode of the other output transistor, is based on the second pole-potential of the power supply. Hence, the bias current of this output transistor is also maintained even if the power-supply voltage changes.

Both output transistors of the output stage can constitute a class AB amplifier, and can perform a push-pull operation, since they are of common-second-electrode configuration. The amplifier circuit of the present invention can, therefore, provide an output whose amplitude is substantially equal to the power-supply voltage, and can reduce power consumption.

The present invention can provide an amplifier circuit which has an output stage made of a class AB, complementary push-pull circuit, and receiving a bias current remaining constant even if the power-supply voltage fluctuates, or even if its elements have different characteristics. The amplifier circuit can, therefore, provide an output whose amplitude is nearly equal to the power-supply voltage, and can reduce power consumption. Moreover, the amplifier circuit of the invention has a sufficient versatility since its power-supply voltage is not as limited as a conventional one. Further, it can be made of transistors whose characteristics differ to some extent, provided that a proper conductivity type is selected for each transistor. This helps to improve the manufacturing yield of the amplifier circuit, particularly when the circuit is

BRIEF DESCRIPTION OF THE DRAWINGS

FIGS. 5A to 5E show various impedance elements which cnn be used in the circuit shown in FIG. 4;

DETAILED DESCRIPTION OF THE PREFERRED EMBODIMENTS

The amplifier circuit according to a first embodiment of the present invention will be described with reference to FIG. 2, which schematically shows this circuit.

Figure 1:
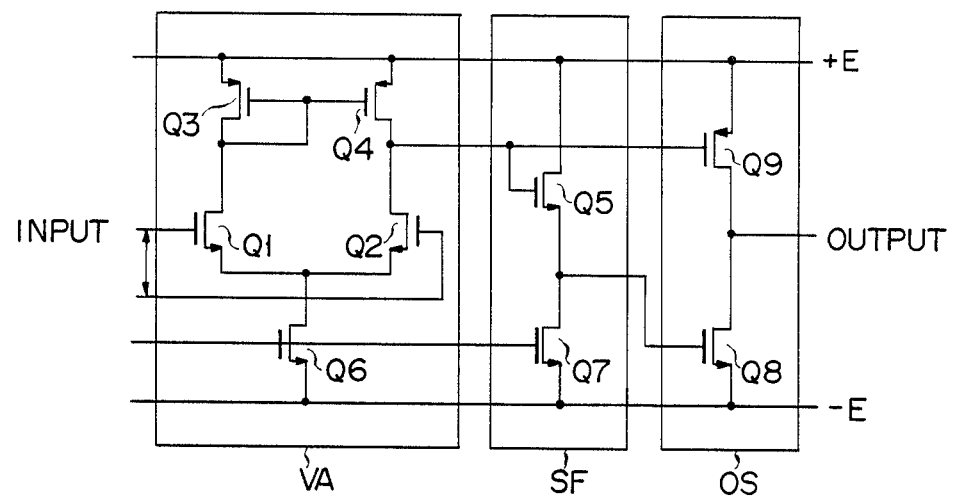
FIG. 1 is circuit diagram showing the major components of a prior art amplifier circuit.
Figure 2:
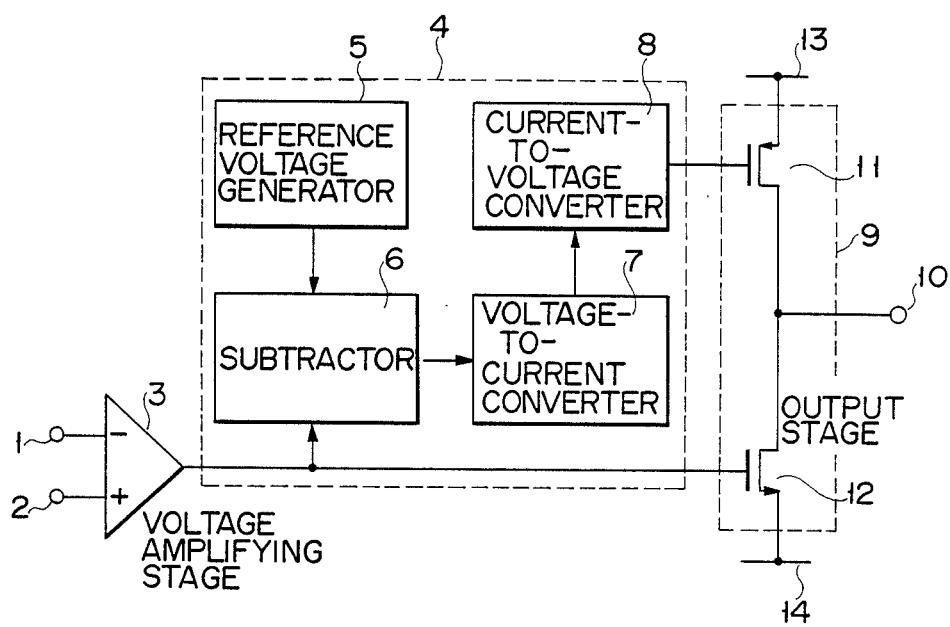
FIG. 2 is a schematic diagram of an amplifier circuit according to a first embodiment of the present invention.

As is shown in FIG. 2, an input signal is applied between input terminals 1 and 2. This signal is supplied to voltage-amplifying stage 3. The output of voltage-amplifying stage 3 is input through drive stage 4 to output stage 9.

Drive stage 4 is designed to drive output stage 9. It comprises reference voltage generator 5, subtracter 6, voltage-to-current converter 7, and current-to-voltage converter 8. Subtracter 6 outputs a difference between the output voltage of voltage-amplifying stage 3 and the reference voltage output by voltage generator 5. Voltage-to-current converter 7 converts this difference voltage to a current signal. Current-to-voltage converter 8 converts the current signal to a voltage signal. The output voltage of converter 8 is applied to the gate of PMOSFET 11 (i.e. a FET of a first conductivity type). The output voltage of voltage-amplifying stage 3 is applied to the gate of NMOSFET 12 (i.e., an FET of the second conductivity type). PMOSFET 11 and NMOSFET 12 constitute output stage 9.

The source of PMOSFET 11 of output stage 9 is coupled to first potential point 13 (or positive pole) of a power supply. The source of NMOSFET 12 of output stage 9 is connected to the second potential point 14 (or negative pole) of the power supply. The drains of FETs 11 and 12 are connected. The node of these FETs is coupled to output terminal 10.

The amplifier circuit of FIG. 2 is characterized by the structure of drive stage 4. The fundamental operation of drive stage 4 will now be explained. The output voltage of voltage-amplifying stage 3 is applied to one input terminal of subtracter 6, and the reference voltage is applied from reference voltage generator 5 to the other input terminal of subtracter 6. Subtracter 6 inverts the phase of the output voltage of voltage-amplifying stage 3. To make both FETs 11 and 12 correctly operate as a class AB amplifier during the voltage-to-current conversion performed by converter 7 and also during the current-to-voltage conversion achieved by converter 8, signal conversion, which is equivalent to the level-shifting carried out in the conventional amplifier circuit, is performed. It is important that the gain of subtracter 6 and the amount of the level-shifting achieved by converters 7 and 8 should not depend upon the power-supply voltage determined by the potentials of first and second points 13 and 14. Since voltage-to-current converter 7 inverts the phase of the output signal from subtracter 6, the output voltage of voltage-amplifying stage 3 and the gate voltage of PMOSFET 11 must be in an in-phase state. To this end, the phase of the output voltage of stage 3 is inverted by subtracter 6. Subtracter 6 is used to invert the phase of the output voltage of stage 3 for the purpose of preventing the phase-inverted output voltage from depending upon the power-supply voltage. If a simple, common-source circuit were employed to invert the phase of the output voltage of stage 3, the phase-inverted voltage would inevitably vary when the power-supply voltage changes.

The amplifier circuit of FIG. 2 will now be described in greater detail, with reference to the circuit diagram of FIG. 3.

Figure 3:
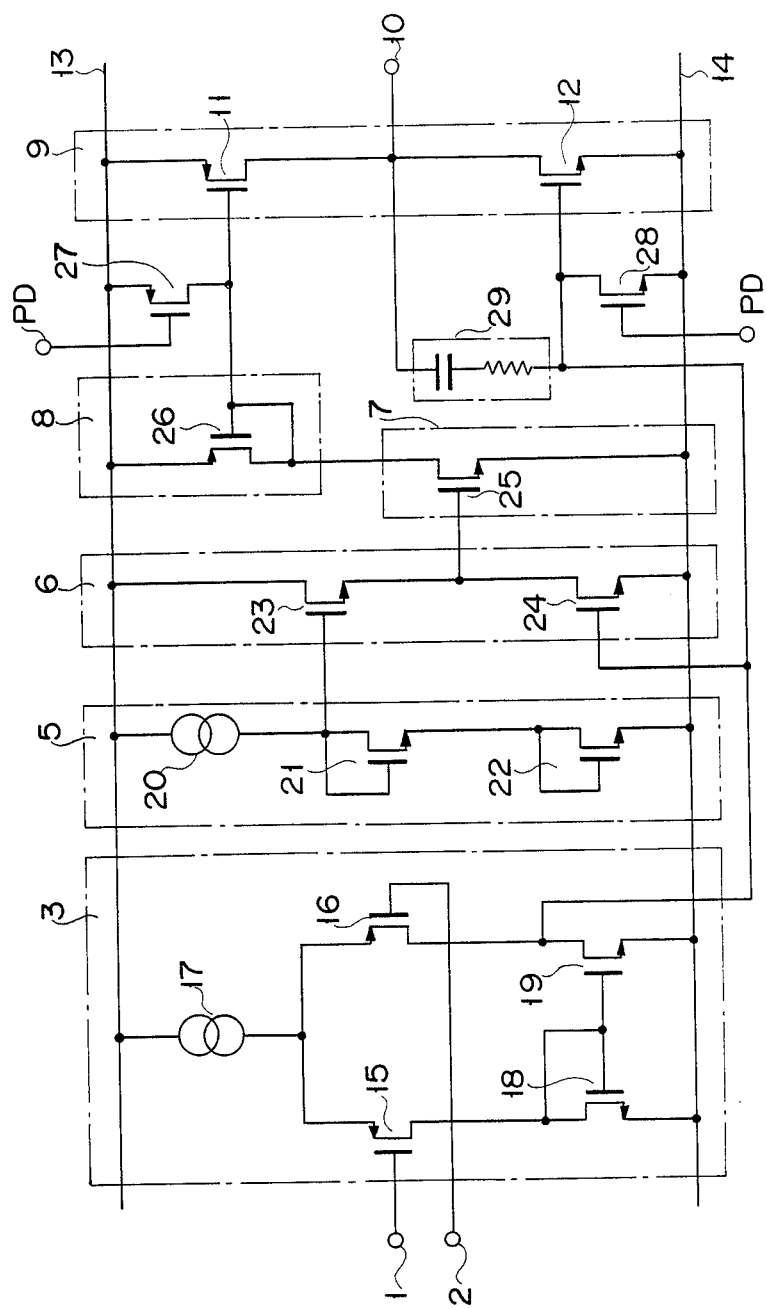
FIG. 3 is a circuit diagram illustrating the amplifier circuit of FIG. 2 in greater detail.

As is shown in FIG. 3, voltage-amplifying stage 3 is a different amplifier comprising two PMOSFETs 15 and 16, a constant current source 17, and two NMOSFETs 18 and 19. The gates of PMOSFETs 15 and 16 are coupled to input terminals 1 and 2, respectively. The sources of PMOSFETs 15 and 16 are connected, and their node is coupled to constant current source 17. NMOSFETs 18 and 19 are connected, as loads, to the drains of PMOFETs 15 and 16, respectively. NMOSFET 18 is diode-connected; its gate and drain are short-circuited. The gates of NMOSFETs 18 and 19 are coupled, whereby NMOSFETs 18 and 19 form a so-called current mirror circuit. The output voltage of voltage-amplifying stage 3 is output from the node of the drains of PMOSFET 16 and NMOSFET 19.

Reference voltage generator 5 comprises constant current source 20 and two NMOSFETs 21 and 22. NMOSFETs 21 and 22 are connected in series, thus forming a series circuit. A constant DC current is supplied to this series circuit from current source 20. NMOSFETs 21 and 22 are each diode-connected, and are connected in series to each other. The node of constant current source 20 and the drain of NMOSFET 21 is the output terminal of reference voltage generator 5. Hence the current flowing through NMOSFETs 21 and 22 remains unchanged, even if the powersupply voltage applied to first and second potential points 13 and 14 changes. The reference voltage generated by generator 5 does not vary substantially, and remains at about 2Vthn, where Vthn is the threshold voltage of NMOSFETs 21 and 22. When voltage Vthn fluctuates for some reason, the reference voltage will vary. Nonetheless, the influence of this voltage fluctuation will be cancelled by subtracter 6.

Subtracter 6 comprises two NMOSFETs 23 and 24. NMOSFET 23 is connected at its drain to first potential point 13, at its gate to the output terminal of reference voltage generator 5, and at its source to the drain of NMOSFET 24. NMOSFET 24 is connected at its gate to the output terminal of voltage-amplifying stage 3, and at its source to second potential point 14. The node of the source of NMOSFET 23 and the drain of NMOSFET 24 is the output terminal of subtracter 6. Therefore, the same current flows through NMOSFETs 23 and 24.

The voltage which subtracter 6 outputs when no signal is input to it should be made equal to the voltage which voltage-amplifying stage 3 outputs when no signal is input to it. To achieve this requirement, it suffices to select such currents for stage 3 and/or voltage generator 5 and to select such dimensions for the FETs, that the voltage, which stage 3 outputs when no signal is input to it, becomes equal to the drain voltage of NMOSFET 22 of generator 5, which is half the output voltage of reference voltage generator 5. Since the voltages which stages 3 and subtracter 6 output when no signals are input to them are made equal by this method, the bias currents of MOSFETs 11 and 12 forming output stage 9 can be equal.

NMOSFET 24 of subtracter 6 forms a common-source amplifier, using MOSFET 23 as a load. The output voltage of voltage-amplifying stage 3 is inverted and amplified by subtracter 6. Since the same current flows through NMOSFETs 23 and 24, the transmission conductances gm of these NMOSFETs are equal. NMOSFET 23 has an impedance of about 1/gm, with respect to NMOSFET 24. The voltage gain of subtracter 6, with respect to the output voltage of voltage-amplifying stage 3, is therefore:

$$-gm \times (1/gm) = -1$$

This voltage gain is held almost unchanged, even if the power-supply voltage and the characteristics of the elements, such as threshold voltage Vthn, fluctuate.

As is shown in FIG. 3, voltage-to-current converter 7 is comprised of NMOSFET 25, whose gate is coupled to the output terminal of subtracter 6, and whose source is connected to second potential point 14. The drain of NMOSFET 25 is the output terminal of voltage-to-current converter 7. On the other hand, current-to-voltage converter 8 is comprised of diode-connected PMOSFET 26 whose drain and gate are coupled to the output terminal of voltage-to-current converter 7 (i.e., the drain of NMOSFET 25), and whose source is coupled to first potential point 13. The node of the drain and gate of PMOSFET 26 is connected to the gate of PMOSFET 11 of output stage 9.

Voltage-to-current converter 7 and current-to-voltage converter 8 cooperate, thus shifting the level of the output voltage of subtracter 6 in the forward direction. The output current of converter 7 remains constant, even if the power-supply voltage or the characteristic of NMOSFET 25 fluctuates. Hence, the amount of the level-shifting is automatically adjusted by the fluctuation of the power-supply voltage or the characteristic of NMOSFET 25, such that the output voltage of current-to-voltage converter 8 also remains constant with respect to first potential point 13. Converters 7 and 8 can thus shift the level of the output voltage of subtracter 6 by an optimum amount, unlike the source-follower stage of the conventional amplifier circuit, which is adversely influenced by the fluctuation of either the power-supply voltage or the characteristics of its elements. In other words, the amount of level-shifting is automatically controlled so that output stage 9 can maintain a predetermined bias current, even if the power-supply voltage or the characteristic of its elements fluctuate.

The amplifier circuit of FIG. 3 further includes one PNMOSFET 27 and one NMOSFET 28, both provided for reducing the power consumption of the circuit. The source and drain of PMOSFET 27 are connected to the source and gate of PMOSFET 11 of output stage 9. The source and drain of NMOSFET 28 are connected to the source and gate of NMOSFET 12 of output stage 9. When there is no need of supplying power to the load of the amplifier circuit, power-down control signal PD is supplied to the gates of MOSFETs 27 and 28, thereby rendering these MOSFETs conductive. As a result, MOSFETs 27 and 28 make MOSFETs 11 and 12 non-conductive, whereby no current flows through MOSFETs 11 and 12 to save power, as long as no significant input signals are input to voltage-amplifying stage 3, and hence no power needs to be supplied to the load.

The circuit of FIG. 3 further includes series circuit 29 of a capacitor and a resistor. The capacitor is coupled to output terminal 10. Circuit 29 is a phase compensation circuit for stabilizing the operation of the amplifier circuit when a negative feedback is applied from output terminal 10 to voltage-amplifying stage 3.

In order to operate in such a way as described above, the amplifier circuit of FIG. 3 needs to fulfill only one design requirement. This requirement is that MOSFETs 18 and 19 of the current mirror (i.e., the load of the differential amplifier), MOSFETs 21 and 22 of reference voltage generator 5, MOSFETs 23 and 24 of subtracter circuit 6, and MOSFET 25 of voltage-to-current converter 7 should have the same ratio of gate width to gate length (hereinafter called "size ratio").

When no signal is input to voltage-amplifying stage 3, the same current, IQ/2, flows through NMOSFETs and 19, where IQ is the current supplied from constant current source 17. Both NMOSFETs 18 and 19, therefore, have the same drain-source voltage of VQ. Since the gate-source voltage of NMOSFET 12 of output stage 9 is also VQ and equal to the gate-source voltage of NMOSFET 19 of stage 3, the drain current of NMOSFET 12 is given as:

$$\frac{\text{Size ratio of FET 12}}{\text{Size ratio of FET 19}} \times \frac{IQ}{2}$$

The current supplied from constant current source 20 for reference voltage generator 5 is selected to be half the current supplied by constant current source 17 for voltage-amplifying stage 3, that is, IQ/2. Hence, a current of IQ/2 flows through NMOSFETs 21 and 22 of reference voltage generator 5. The drain-source voltages of these transistors are therefore VQ.

In subtracter 6, the gate-source voltage of NMOSFET 24 is equal to the drain-source voltage, VQ, of NMOSFET 19. For this reason, the gate-source voltage of the other NMOSFET 23 of subtracter 6 is also VQ. As a result, the currents flowing through both FETs 23 and 24 are IQ/2.

Moreover, the output voltage of reference voltage generator 5 is 2VQ, whereas the output voltage of subtracter 6 is VQ. It follows that the input voltage of voltage-to-current converter 7 (i.e., the gate-source voltage of NMOSFET 25) is VQ. Hence, the output current of converter 7 (i.e., the drain current of NMOSFET 25) is IQ/2. The drain current of PMOSFET 11 of output stage 9 is thus given as:

$$\frac{\text{Size ratio of FET 11}}{\text{Size ratio of FET 26}} \times \frac{IQ}{2}$$

Therefore, it is sufficient that PMOSFET 26 of current-to-voltage converter 8 has such a size ratio that the same current flows through PMOSFET 28 as flows through PMOSFET 11 of output stage 9.

The bias current of NMOSFET 12, i.e., one of the two MOSFETs forming output stage 9, takes the following value determined by the output current of constant current source 17 provided within voltage-amplifying stage 3:

$$\frac{IQ}{2} \times \frac{\text{Size ratio of FET 12}}{\text{Size ratio of FET 19}}$$

Obviously, the bias current of NMOSFET 12 remains unchanged, regardless of the changes in the power-supply voltage. Further, the amount of the level-shifting of the output voltage of stage 3, which is achieved by subtracter 6 and converters 7 and 8, varies as the power-supply voltage changes. The bias current of PMOSFET 11, therefore, remains constant in spite of the changes of the power-supply voltage.

Neither the bias current of PMOSFET 11 nor the bias current of NMOSFET 12 can remain unchanged even if the characteristics of these MOSFETs fluctuate. More specifically, NMOSFET 12 is driven by the drain-source voltage of NMOSFET 19 provided in voltage-amplifying stage 3. The fluctuation of the characteristic (e.g., the threshold voltage) of PMOSFET 11 is thus cancelled by the similar characteristic-fluctuation of NMOSFET 19. The bias current of NMOSFET 12 thereby remains constant. The bias current of PMOSFET 11 also remains unchanged even if the characteristics (e.g., the threshold voltages) of PMOSFETs 11 and 26 fluctuate. This is because of the following reasons. First, the output current of voltage-to-current converter 7 is not influenced by the characteristic fluctuation of MOSFETs 21 to 25 forming reference voltage generator 5, subtracter 6, or voltage-to-current converter 7, since all these MOSFETs are of the same type, i.e., an N-channel type. Second, PMOSFET 26 forming current-to-voltage converter 8 is driven by a current, and jointly constitutes a current mirror circuit with PMOSFET 11 of output stage 9.

As has been described above, the bias currents of MOSFETs 11 and 12 of output stage 9 remain constant even if the power-supply voltage or their characteristics fluctuate, and are thus equal to each other. MOSFETs 11 and 12 can therefore operate in the AB mode, and can perform a push-pull operation. As a result, the maximum output voltage applied from output terminal 10 can have an amplitude as great as that of power-supply voltage, and the power consumption of the amplifier circuit can be reduced to a minimum.

The minimum power-supply voltage, which can drive the amplifier circuit in a normal way, is determined by the output voltage of reference voltage generator 5. It is approximately the sum of 2 Vthn and the voltage which constant current source 20 requires in order to supply the predetermined constant current. Since threshold voltage Vthn is about 1 V, the minimum power-supply voltage is extremely low, about 2 V. The amplifier circuit of the present invention can not only use the power-supply voltage with a high efficiency, but it also can be effectively driven by a relatively low voltage. In view of this, the amplifier circuit is advantageous, particularly when its power supply is a battery.

The maximum output current of the first embodiment (FIG. 3) will now be discussed.

When the output voltage of voltage-amplifying stage 3 reaches its maximum value Vmax, which is measured based on the negative power-supply voltage applied to second potential point 14, NMOSFET 24 is almost completely turned on. The gate-source voltage of NMOSFET 25 falls substantially to 0 V, whereby no current flows through PMOSFET 26 or through PMOSFET 11 of output stage 9. Maximum output voltage Vmax is generated the moment PMOSFET 26 is completely turned on and PMOSFET 15 is completely turned off. Assume that an analog ground potential is applied to input terminal 2, just as in the case of an ordinary inverting amplifier. (The analog ground potential is VDD/2, where VDD is the power-supply voltage applied between first and second potential points 13 and 14.) Then, maximum output voltage Vmax can be given as:

$$Vmax = VDD/2 + Vthp$$

where Vthp is the threshold voltage of PMOSFET 16. The gate-source voltage of NMOSFET 12 of output stage 9 is the maximum output voltage Vmax of voltage-amplifier stage 3. Hence, as is well known in the art, NMOSFET 12 tends to pass current ID which is given as:

$$ID \approx \frac{W}{L} \times \frac{Kp}{2} \times (Vmax - Vthn)^2$$

where W and L are the gate width add gate length of NMOSFET 12, Kp is the transconductance parameter of NMOSFET 12, and Vthn is the threshold voltage of NMOSFET 12. When no signal is input to voltage-amplifying stage 3, the gate-source voltage of NMOSFET 12 is approximately Vthn, or about 1 V. In this condition, a current tens of times greater than the bias current of NMOSFET 12 flows through NMOSFET 12 if power-supply voltage VDD is several volts. Hence, the higher the power-supply voltage VDD, the greater the current ID.

The output voltage of voltage-amplifying stage 3 falls to a minimum when PMOSFET 16 is completely turned off, and PMOSFET 15 is completely turned on. The minimum voltage Vmin is about 0 V as compared to the negative voltage applied to second potential point 14. That is, Vmin ≈ 0 V. At this time, both NMOSFET 24 and NMOSFET 12 of output stage 9 are turned off, and allow no passage of current. Accordingly, no current flows through NMOSFET 23, either, whereby the gate-source voltage of NMOSFET 25 becomes equal to the drain voltage of NMOSFET 21. That is, the gate-source voltage of NMOSFET 25 becomes about 2 Vthn, where Vthn is the threshold voltage of NMOSFETs 21 and 22; this gate-source voltage cannot become higher than 2 Vthn. Therefore, the maximum current which can flow through PMOSFET 11 remains unchanged, even if power-supply voltage VDD rises, unlike the maximum current which can flow through NMOSFET 12. That is, when the resistance of the load coupled to output terminal 10 is low, the positive side of the maximum output voltage (amplitude) is clipped before the negative side thereof. In order to avoid this undesirable phenomenon, it suffices to raise the drain voltage of NMOSFET 24 above a value slightly greater than 2 Vthn, for example, above the voltage applied at first potential point 13, when NMOSFET 24 is turned off.

Figure 4:
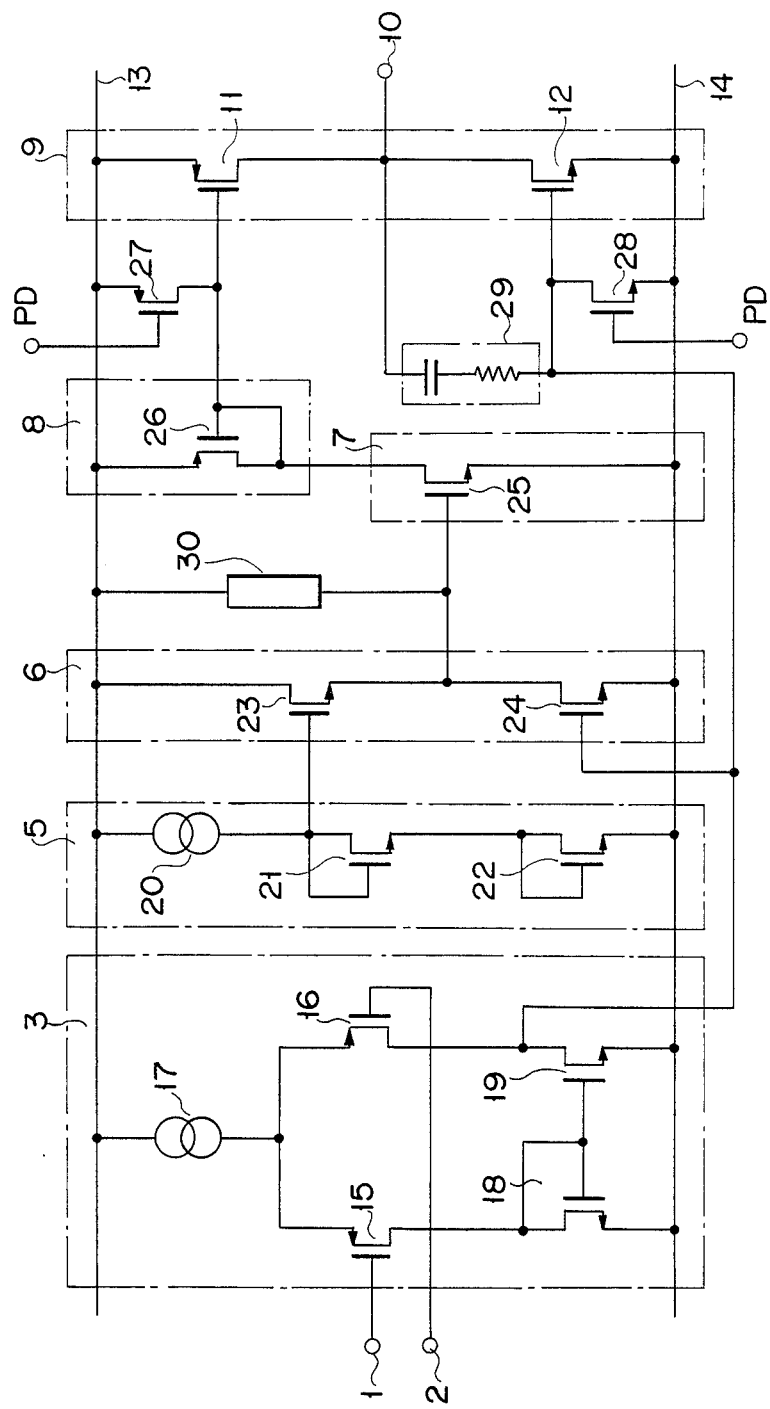
FIG. 4 is a circuit diagram showing an amplifier circuit according to a second embodiment of the invention.

FIG. 4 shows a second embodiment of the present invention, wherein the drain voltage of NMOSFET 24 can be raised above the voltage applied at first potential point 13 when NMOSFET 24 is turned off. In FIG. 4, the same elements as those shown in FIG. 3 are designated by the same numerals as those used in FIG. 3. These elements will not be described in detail.

As is shown in FIG. 4, high-impedance element 30 is connected between first potential point 13 and the drain of NMOSFET 24 provided in subtracter 6. (The drain of NMOSFET 24 is connected to the source of NMOSFET 23 also provided in subtracter 6). High-impedance element 30 pulls up the drain voltage of NMOSFET 24 to the potential of point 13 only when NMOSFET 24 is turned off.

When NMOSFET 24 is turned off, its drain attains an extremely high impedance (e.g., about $10^{12}$ Ω) Hence, element 30 has an impedance which is much lower than the drain impedance NMOSFET 24 has when it is turned off, and allows a current far smaller than the bias current of NMOSFET 24 to flow through NMOSFET 24 when this NMOSFET is turned on.

Impedance element 30, coupled between first potential point 13 and the drain of NMOSFET 24, also pulls up the gate voltage of NMOSFET 25 forming voltage-to-current converter 7 only when NMOSFET 24 is turned off. As long as NMOSFET 24 is on, high-impedance element 30 has virtually no influence on the gate-source voltage of NMOSFET 25. In other words, element 30 on the gate-source voltage of NMOSFET 24 can be regarded as nonexistent. When NMOSFET 24 is turned off, element 30 can pull up the gate-source voltage of NMOSFET 25 to power-supply voltage VDD. The amplifier circuit shown in FIG. 4 can, therefore, drive a greater load than the amplifier circuit of FIG. 3 can.

FIGS. 5A to 5E show various impedance elements that can be used as high-impedance element 30 shown in FIG. 4.

The impedance element shown in FIG. 5A is a resistor. The impedance elements illustrated in FIGS. 5B and 5C are each comprised of a MOSFET which functions as a resistor in the triode region. The elements of FIGS. 5B and 5C have an impedance as high as, for example, several megaohms. The element of FIG. 5D is a current source which generates a current which is far smaller than the bias current of NMOSFET 24. Practically, the element of FIG. 5D comprises a FET, as is shown in FIG. 5E. An appropriate bias voltage VB is applied to the gate of the FET, thereby to generate a current of a desired value.

Figure 6A:
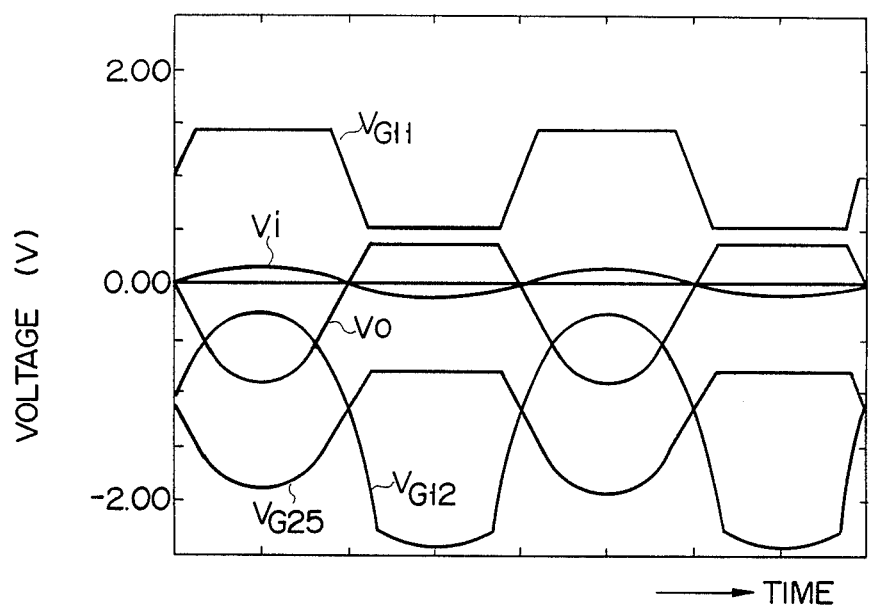
FIGS. 6A to 6B shows the waveforms of various signals, explaining the difference in operating characteristics between the amplifier circuits of FIGS. 3 and 4, both having a relatively heavy load.
Figure 6B:
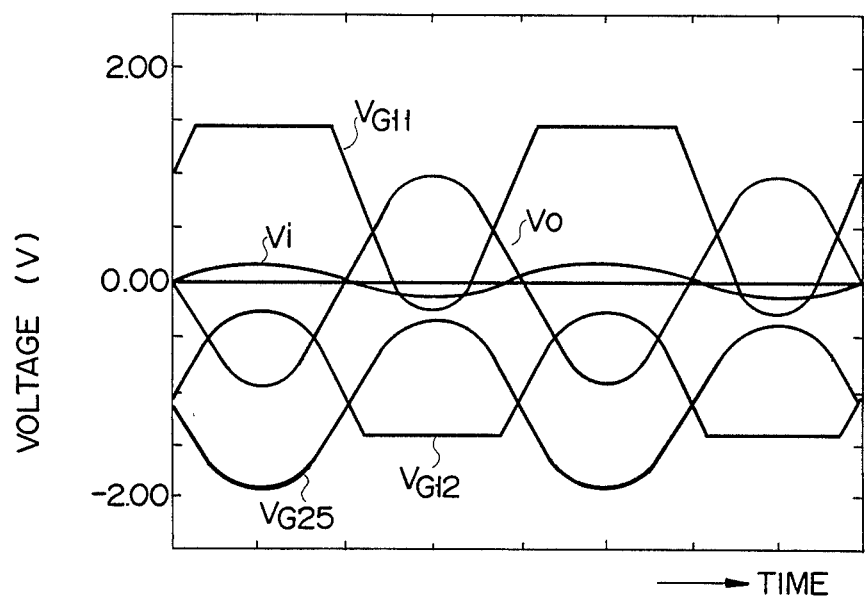

FIG. 6A shows the waveforms of various signals produced in an inverting amplifier which is made of the first embodiment (FIG. 3) and which has a voltage gain of 10. FIG. 6B shows the waveforms of the signals generated in an inverting amplifier which is comprised of the second embodiment (FIG. 4) and which also has a voltage gain of 10. For both inverting amplifiers, the power-supply voltage is ±2.5 V. The inverting amplifiers are structurally the same, except that one has impedance (actually, a resistor), whereas the other has no impedance element. More precisely, FIGS. 6A and 6B show the waveforms of input voltage Vi, voltage Vo output from terminal 10, the gate voltage VG11 of PMOSFET 11, the gate voltage VT12 of NMOSFET 12, and the gate voltage VG25 of NMOSFET 25.

As is evident from FIG. 6A, in the circuit of FIG. 3, output voltage Vo is clipped from the positive side as the load increases. This is because the gate voltage VG25 of NMOSFET 25 is clipped from the positive side, as is illustrated in FIG. 6A. In contrast, in the circuit of FIG. 4, the gate voltage VG25 of NMOSFET 25 is not clipped at all, as is clearly understood from FIG. 6B, since high-impedance element 30 is provided. Further, as the waveforms of the gate voltages VG11 and VG12 of MOSFETs 11 and 12, both shown in FIG. 6B, clearly show, output stage 9 operates in the class AB mode.

Figure 7:
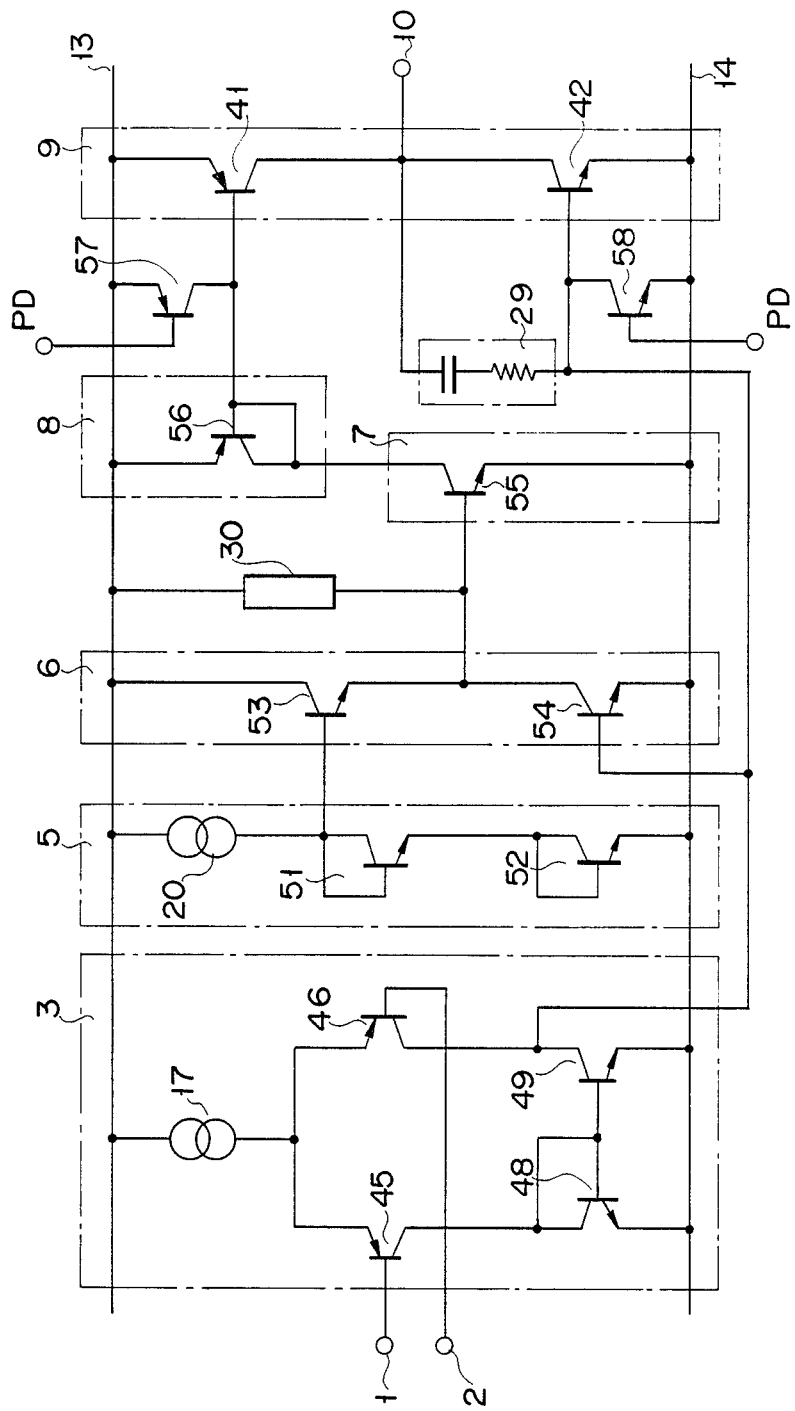
FIG. 7 is a circuit diagram illustrating an amplifier circuit according to a third embodiment of this invention.

FIG. 7 shows an amplifier circuit according to a third embodiment of the present invention. As is evident from FIG. 7, this amplifier circuit is identical to the circuit of FIG. 4, except that bipolar transistors are used in place of MOSFETs. That is, PNP transistors 41, 45, 56, and 57 are used instead of PMOSFETs 11, 15, 16, 26, and 27; and NPN transistors 42, 48, 49, 51, 52, 53, 54, 55, and 58 are used in place of NMOSFETs 12, 18, 19, 21, 22, 23, 24, 25, and 28.

The third embodiment operates basically in the same manner as the second embodiment shown in FIG. 4.

The MOSFETs used in the first embodiment of FIG. 3 can be replaced by bipolar transistors. However, for the reasons stated above in the description of the second embodiment, the circuit of FIG. 7 is preferred since it can stably operate in a broad range of powersupply voltage and in a broad load range. It can operate more stably in the class AB mode.

The present invention is not limited to the embodiments described above. Various changes or modifications can be made without departing from the spirit and scope of the invention.

The ratio of the current supplied by constant current source 17 to the voltage provided by constant current source 20, and the gains of the components of any embodiment described above can be altered so long as the same advantages as those of the above embodiments can be achieved.

Needless to say, the same advantages can be attained if the NMOSFETs used in the above embodiments are replaced by PMOSFETs, and vice versa, and if the polarity of the power-supply voltage is inverted.

What is claimed is:

1. An amplifier circuit comprising:
a voltage-amplifying stage for amplifying the voltage of an input signal;
a drive stage having reference voltage-generating means for generating a predetermined reference voltage, subtracting means for generating a voltage equal to a difference between said reference voltage and an output voltage of said voltage-amplifying stage, which is based on the first pole-potential of a power supply, and signal-converting means for converting the voltage generated by said subtracting means to a voltage signal based on the second pole-potential of the power supply; and
an output stage including a push-pull circuit comprised of at least one complementary pair of output transistors, one of said output transistors being driven by the voltage signal output from said signal-converting means, and the other of said output transistors being driven by the output voltage of said voltage-amplifying stage.

2. An amplifier circuit according to claim 1, wherein said output stage has a complementary push-pull circuit including a pair of output transistors which are of the first and second conductivity types, respectively, and each have a first electrode for supplying carriers, a second electrode for taking the carriers out and a third electrode for controlling a flow of the carriers, are connected at the first electrode to first and second potential points of said power supply, respectively, and at the second electrode to each other, thus forming a node from which an output is supplied, said output voltage of said voltage-amplifying stage being applied between the first and third electrodes of the output transistor of the second conductivity type; said reference voltage-generating means comprises transistors of the second conductivity type; said subtracting means comprises transistors of the second conductivity type; and said signal-converting means includes voltage-to-current converting means comprised of a transistor of the second conductivity type for outputting a current corresponding to the output voltage of said subtracting means, and current-to-voltage converting means comprised of a transistor of the first conductivity type for generating a voltage corresponding to the output current of said voltage-to-current converting means, and designed to apply said voltage between the first and third electrodes of said output transistor of the first conductivity.

3. An amplifier circuit according to claim 2, wherein the transistors of the first conductivity type are PMOSFETs, the transistors of the second conductivity type are NMOSFETs, and the first, second and third electrodes are a source, a drain and a gate, respectively.

4. An amplifier circuit according to claim 2, wherein the transistors of the first conductivity type are PNP bipolar transistors, the transistors of the second conductivity type are NPN bipolar transistors, and the first, second and third electrodes are an emitter, a collector and a base, respectively.

5. An amplifier circuit according to claim 2, wherein said reference voltage-generating means comprises a circuit having two diode-connected transistors of the second conductivity type connected in series to each other, and a constant current source for supplying a constant DC to these two transistors, and using a node of said constant current source and one of said two transistors as an output terminal; said subtracting means comprises a circuit having two transistors of the second conductivity type and using a node of the first electrode of one of these two transistors and the second electrode of the other of these two transistors as an output terminal, one of said two transistors being connected at the second and third electrodes to a first potential point and the output terminal of said reference voltage-generating means, respectively, and the other of said two transistors being connected at the second and third electrodes to the first electrode of said one transistor and the output terminal of said voltage-amplifying stage, respectively; said voltage-to-current converting means comprises a circuit having a transistor of the second conductivity type and using the second electrode of this transistor as an output terminal, said transistor being connected at the first electrode to a second potential point and at the third electrode to the output terminal of said subtracting means; and said current-to-voltage converting means comprises a circuit having a transistor of the first conductivity type and using a node of the second and third electrodes of this transistor as an output terminal, said transistor being connected at the second and third electrodes to the second electrode of the transistor of said voltage-to-current converting means, at the first electrode to said first potential point, and at the third electrode to the third electrode of said output transistor of the first conductivity type.

6. An amplifier circuit according to claim 5, wherein the transistors of the first conductivity type are PMOSFETs, the transistors of the second conductivity type are NMOSFETs, and the first, second and third electrodes are a source, a drain and a gate, respectively.

7. An amplifier circuit according to claim 5, wherein the transistors of the first conductivity type are PNP bipolar transistors, the transistors of the second conductivity type are NPN bipolar transistors, and the first, second and third electrodes are an emitter, a collector and a base, respectively.

8. An amplifier circuit according to claim 5, wherein a high-impedance element is connected between the output terminal of said subtracting means and said first potential point for pulling up the potential of the output terminal of said subtracting means.

9. An amplifier circuit according to claim 8, wherein the transistors of the first conductivity type are PMOSFETs, the transistors of the second conductivity type are NMOSFETs, and the first, second and third electrodes are a source, a drain and a gate, respectively.

10. An amplifier circuit according to claim 8, wherein the transistors of the first conductivity type are PNP bipolar transistors, the transistors of the second conductivity type are NPN bipolar transistors, and the first, second and third electrodes are an emitter, a collector and a base, respectively.

11. An amplifier circuit according to claim 2, wherein a first control transistor of the first conductivity type is connected at a first electrode to the first potential point, and at a second electrode to the third electrode of the output transistor of the first conductivity type, said first control transistor being turned on to render the output transistor nonconductive when it is unnecessary to supply the output of the amplifier circuit to a load; and a second control transistor of the second conductivity type is connected at a first electrode to the second potential point, and at a second electrode to a third electrode of said output transistor of the second conductivity type, said second control transistor being turned on to render this output transistor non-conductive in cooperation with said first control transistor, when it is unnecessary to supply the output of the amplifier circuit.

12. An amplifier circuit according to claim 11, wherein the transistors of the first conductivity type are PMOSFETs, the transistors of the second conductivity type are NMOSFETs, and the first, second and third electrodes are a source, a drain and a gate, respectively.

13. An amplifier circuit according to claim 11, wherein the transistors of the first conductivity type are PNP bipolar transistors, the transistors of the second conductivity type are NPN bipolar transistors, and the first, second and third electrodes are an emitter, a collector and a base, respectively.

* * * * *